THERMOELECTRIC DEVICE

Filed Dec. 18, 1963 2 Sheets-Sheet 1

Inventor
Robert J. Campana

By Anderson, Luedeka, Fitch, Even & Tabin
Att'ys

Inventor
Robert J. Campana
By
Anderson, Luedeka, Fitch, Even & Tabin
Atty's

United States Patent Office 3,413,156

Patented Nov. 26, 1968

3,413,156

THERMOELECTRIC DEVICE

Robert J. Campana, Solana Beach, Calif., assignor, by mesne assignments, to Gulf General Atomic Incorporated, San Diego, Calif., a corporation of Delaware Filed Dec. 18, 1963, Ser. No. 331,522
9 Claims. (Cl. 136—212)

ABSTRACT OF THE DISCLOSURE

Thermoelectric generator using radiation coupling between the source of heat and collector plates joined to the hot junctions of the thermoelectric elements to transfer heat primarily via radiation and thus eliminate structural connections to the hot junctions of the thermoelectric elements which are supported only via connections to the radiators. With a supply of heat, such as a heated fluid stream where the intensity varies with direction of flow, the collector plates are made with differing radiative absorptivities to approximately equalize the hot junction temperatures of the thermoelectric pairs. End caps attached to the thermoelectric elements are welded at the circumference of undersized holes in the collectors.

The present invention relates to thermoelectric devices and to a method of making such devices. More particularly, the invention relates to thermoelectric devices which can be operated at relatively high operating temperatures and to a method of making the same.

Generally, a thermoelectric device includes a plurality of interconnected pairs of p-type and n-type semiconductors. In such a pair, one end of the p-type semiconductor (i.e., one which has been doped with an acceptor impurity) is electrically connected to one end of the n-type semiconductor (i.e., one which has been doped with a donor impurity) by a common electrode or conductor to form a thermocouple. In this application the term thermocouple will be used to designate a device for generating a thermal E.M.F. Normally, electrical connections are made to the other end of each of the semiconductors by separate electrodes or conductors.

Attempts have been made to provide thermoelectric modules or panels which can be operated at relatively high operating temperatures. Such panels are desirable because the efficiency of the conversion of thermal energy to electric energy in a device of this type increases with an increase in the temperature drop across the thermoelectric element. Therefore, when a higher hot junction temperature can be used, a greater temperature drop can be achieved, resulting in greater operating efficiency. Furthermore, many types of apparatus, such as nuclear reactors, radioisotope capsules, gas burners, solar concentrators, etc., which produce thermal energy in the high temperature range, provide a ready field for the utilization of thermoelectric panels which can carry out direct conversion of high temperature thermal energy to electrical energy.

Previous attempts to produce a thermoelectric panel suitable for operation in this temperature range have been unsatisfactory. The lives of most of the panels produced by these attempts have been cut short by failure of various of the components of the panel, for example, the thermoelectric elements or the bonds thereto, during any extended periods of operation in a high temperature range.

Thermoelectric materials as a class are fragile. The mechanical characteristics of a thermoelectric material, such as compressive strength, tensile strength, thermal expansion, rupture, and elasticity, have been measured and are well known for the thermoelectric materials in general use. Measurements of these parameters have been made over relatively high operating temperatures, about 300 to 500° C.

The measurements of these various parameters of the thermoelectric elements have explained why these failures have occurred. On the basis of these measurements the direct bonding of thermoelectric elements to rigid, hot and cold, heat transfer plates has proved impractical from the standpoint of the varying thermal expansion of the different components.

In some attempts to allow for thermal stress relief, the mechanical coupling of the thermoelectric elements to the hot and cold heat transfer plates has been minimized. However, these attempts have created other problems, increase in the electrical resistance in the connections, reduction in the strength of the thermoelectric device to withstand vibration, shock, etc. None of these attempts has provided a completely satisfactory thermoelectric panel for operation at high operating temperatures.

It is an object of the present invention to provide an improved thermoelectric device which is suitable for operation at high operating temperatures, and to provide a method of making such a thermoelectric device. It is another object to provide a thermoelectric device which adds no additional stresses beyond the stresses which must be sustained by a single thermoelectric element operating at elevated temperatures. It is a further object of the invention to provide a thermoelectric device in which the hot sides of the thermoelectric elements are mechanically decoupled from the support structure, and a method for making such a device. It is a still further object of the invention to provide a thermoelectric device which has sufficient mechanical strength to withstand shock and vibration and at the same time permit mechanical decoupling to allow for thermal expansion. It is another object of the invention to provide an improved thermoelectric device which is designed to have increased operating life at high operating temperatures, and a method for making such a device. These and other objects and advantages of the present invention will become apparent by reference to the following detailed description and accompanying drawings wherein:

Figures 1, 2:
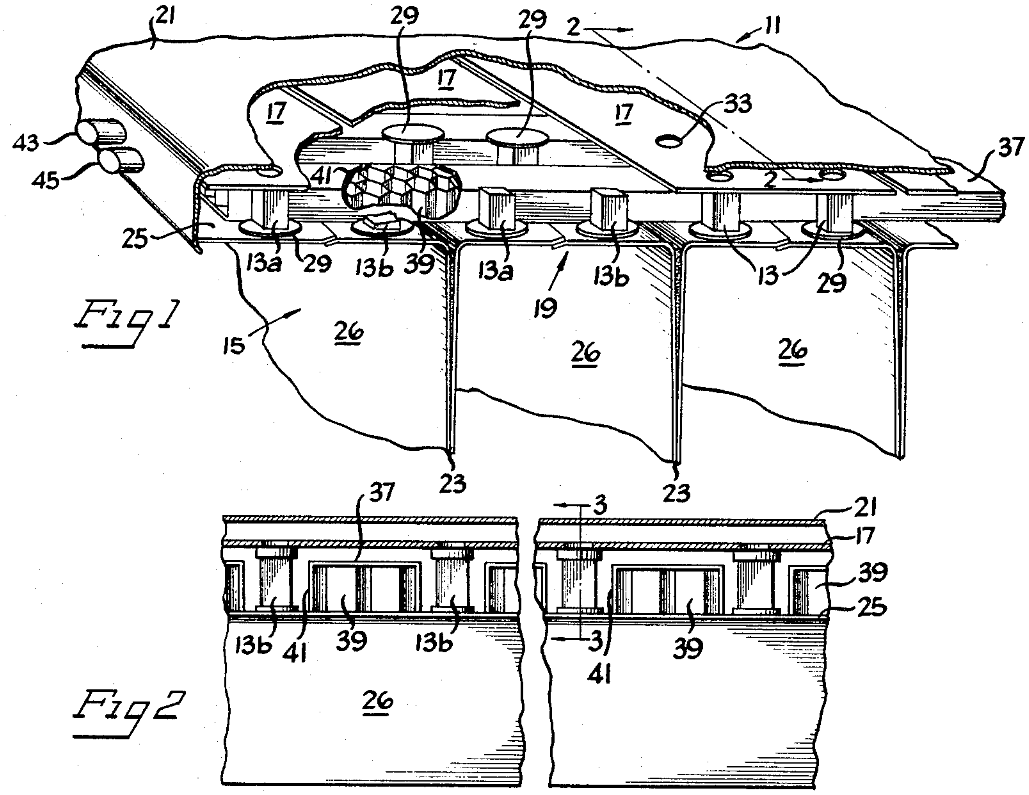
FIGURE 1 is a fragmentary perspective view partially broken away of a thermoelectric panel embodying various of the features of the invention.
FIGURE 2 is a sectional view taken generally along the line 2—2 of FIGURE 1.

It has been found that it is possible to use radiation coupling in the construction of a thermoelectric panel to produce a panel which will remain structurally strong and operative over a long period at relatively high operating temperatures with frequent thermal cycling from hot to cold during on-off operation. The utilization of radiation coupling allows the thermoelectric elements to be separated from rigid heat transfer plates and therefore allows flexibility to be built into the module to alleviate the problems arising from thermal stress.

Generally, the invention provides a thermoelectric panel utilizing a plurality of thermoelectric semiconductor elements which are each bonded at only one point, the cold junction point, to the supporting structure so that the hot junction point of each element is mechanically decoupled from the support structure. Generally, the heat sink plate of the thermoelectric panel is utilized as the main supporting member of the panel. Accordingly, the panel is mounted in the desired location by suitable connections to the heat sink plate.

The thermoelectric semiconductor elements are electrically interconnected at their cold junction points either by separate electrodes mounted on the heat sink plate or through the heat sink plate itself. The hot junction points of individual thermoelectric elements which make up each thermocouple may be connected by separate electrodes extending between each pair; but preferably, collector plates are provided at the hot junction points which both absorb thermal energy for conduction to the semiconductor elements and electrically interconnect adjacent semiconductor elements. Heat transfer structure, either a self-contained heat source or structure which is heated by a heat source, is connected to the heat-source plate and spaced from the collector plates. Thermal energy is transferred radiatively from this structure to the collector plates.

By this novel design, the problems of relative thermal expansion associated with an entire thermoelectric panel are reduced to those associated with only a single thermocouple. Because this design allows relative thermal expansion between the various pairs of elements without interference from adjacent thermocouples, the size of the panel can, in principle, be made indefinitely large without the introduction of added thermal stress, which is the normal result of association of a plurality of thermocouples. From the standpoint of relative expansion alone, the single thermocouple is the basic thermoelectric module. The use of small elements in this novel design is preferred because they permit the use of thinner, lighter, and more flexible collector-connectors which reduce the transmission of thermally induced stresses to the brittle semiconductor elements. For given condition otherwise, the connectors may be made thinner because while the current through an element is proportional to the cross-sectional area (for constant element length) the Joule losses in the connectors ($I^2R$) vary as the square of the current. Therefore, the resistance of the connectors may be increased to offset the current effect, by making the connectors thinner, without changing the Joule losses. Thus, many of the problems of preparing large arrays of thermocouples are eliminated.

The design also provides substantial improvement in mechanical strength over the usual conductive-type module. In the instant, improved design, the thermoelectric elements are supported in substantially cantilever form. Accordingly, they mechanically support only their own weight plus that of a lightweight collector member. There is no mechanical linkage of the principal supporting members of the panel through the elements.

Furthermore, in the improved design, some of the thermal barriers usually encountered as a result of necessary electrical insulation are eliminated from the heat path through the panel. Thus, the temperature drop across the thermoelectric elements themselves is a much larger percentage of the available total temperature drop from the hot junction to the radiator than usually achieved. This feature provides high thermoelectric performance at relatively modest hot junction temperatures, compared to the performance obtainable from mechanically coupled arrangements.

Figure 3:
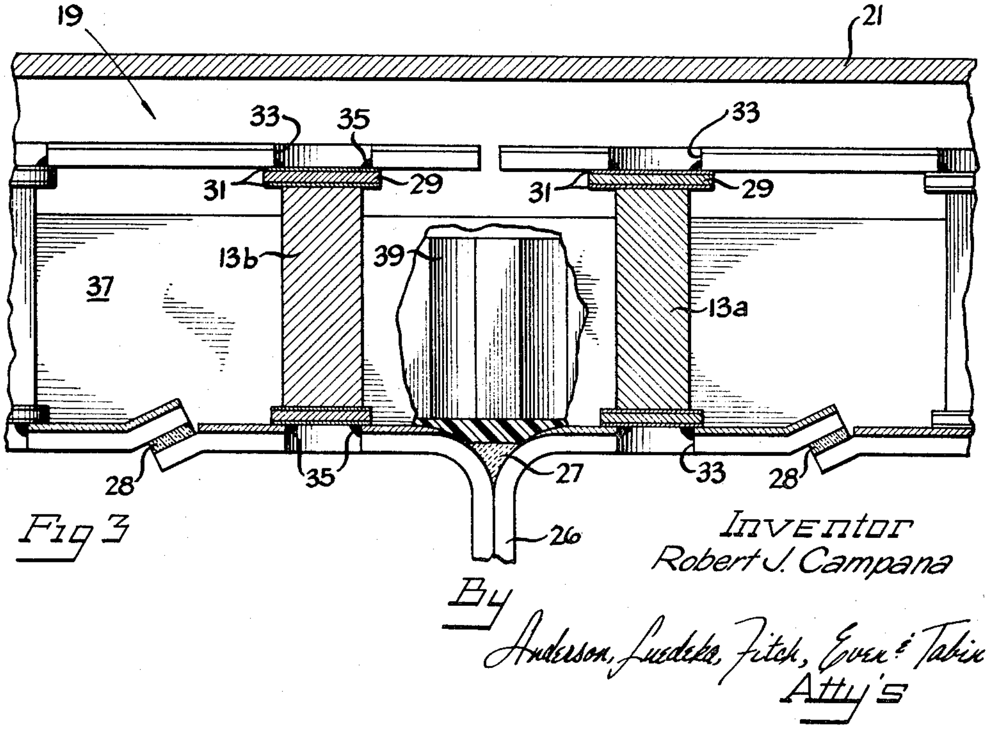
FIGURE 3 is an enlarged fragmentary sectional view taken generally along line 3—3 of FIGURE 2 with parts broken away.

Now referring particularly to FIGURES 1–3, a thermothe features of the invention. The panel 11 generally comprises a plurality of thermoelectric elements 13 each electric panel 11 is illustrated which embodies various of supported at one end (the cold junction point) on a heat sink 15 and each having a collector plate 17 at its other end (the hot junction point). The thermoelectric elements 13 comprise blocks or cylinders of n-type 13*a* and p-type 13*b* thermoelectric semiconductor materials and are electrically interconnected by the heat sink 15 and the collector plates 17 to form thermocouples 19. A heat-source plate and housing 21 is supported about the periphery of the heat sink to form a gas-tight enclosure about the array of thermoelectric elements 13.

The heat sink 15 is the main supporting member of the panel 11 and is formed from a plurality of T-shaped sections 23 joined to form an upper flat plate section 25 upon which the thermoelectric elements 13 are supported and a plurality of fins 26 depending from the underside of the plate section 25. The fins 26 increase the rate of dissipation of heat to the atmosphere and thus serve to keep the temperature of the heat sink 15 as low as possible.

In the illustrated structure, each of the T-shaped sections 23 is formed from L-shaped halves welded together, as at 27, near their corners to provide as short as possible current path in the plate section. The T-shaped sections 23 are made from a material which is both electrically and thermally conductive. Adjacent T-sections 23 are joined by electrically insulating bonds to form the heat sink 15. In the illustrated embodiment, the sections are joined by lap bonds 28 made of a high temperature insulating adhesive such as epoxy resins, silicone resins, or fused high temperature glass. Thus, each T-section electrically connects the thermocouples 19 in series across the panel 11 and also connects the rows of series-connected thermocouples in parallel. The power leads (not shown) are taken from the rear of the plates 25 along each side edge.

The collector plates 17 are thin sheets of electrically and thermally conductive material, such as aluminum, and serve both to collect the radiant heat from the heat-source plate and to electrically interconnect adjacent n and p-type elements to provide a plurality of thermocouples. In the panel 11, the entire support for the thermoelectric elements 13 is through the point of bonding to the heat sink 15. The other ends of the thermoelectric elements 13 are merely interconnected by the thin collector plates 17 and are mechanically decoupled from the support structure.

Although, as previously described, the cold junction points of the thermoelectric elements 13 are connected directly to the heat sink, separate electrodes may be used, if desired, and would be bonded by electrically insulating but thermally conductive bonds to the heat sink structure in order to isolate the heat sink from the electrical circuitry.

In the illustrated design, the heat transfer from the heat-source plate to the hot junction of the thermoelectric elements 13 at the collector plates 17 is accomplished radiatively. A heat source is used to heat the heat-source plate 21, which radiates heat to the collector plates 17. Any suitable heat source may be utilized with such an arrangement, for example, a gas-fired heater. For the generation of power from solar energy, the housing 21 may be made of a material, for example, glass, which is transparent to solar radiation and would allow the solar radiation to heat the collector plates 17.

The temperature capability of the heat source should be considered in a panel wherein radiation coupling is used to link the heat source to the collector members. Radiation coupling is most efficient when the desired heat flux is provided at the highest practical temperatures of heat source and hot junction. Therefore, the improved thermoelectric panel is most efficient when utilized with a source of intense heat. Also, one of the advantageous features of the panel 11 is the amount of practical power density that can be transferred radiatively from the heat source to the collector plates 17.

Various p and n-type thermoelectric semiconductor materials, presently well known in the art, can be used in a panel of this type. The selection of particular thermoelectric materials generally depends upon the temperature range of the intended use of the panel. A relatively high operating temperature compatible with the design life is desirable, in many instances, because the efficiency of a panel of a given size generally increases with an increase in temperature drop across the hot and cold junctions.

The panel 11 is especially designed for operating temperatures in the range wherein the hot junction temperature is about 300° C. or above. Accordingly, semiconductor materials which will function with minimal degradation at these temperatures are selected. N-type lead telluride (PbTe) is one suitable n-type semiconductor material. Zinc antimonide (ZnSb) is a suitable p-type material within this range. PbSnTe, a solid solution of lead telluride and tin telluride, is another suitable p-type material and is considered preferable. These thermoelectric materials withstand very well cycling from room temperature to the contemplated operating temperatures.

The bond between the semiconductor elements 13 and the electrode materials is thermally and electrically conductive. Metals having high electrical conductivity are usually selected as the electrode materials. However, because some such metals act as poison to various types of semiconductors, including PbTe and PbSnTe, some barrier is best established between the semiconductor material and the electrode. Preferably, an intermediate metal is used to provide a diffusion barrier between the conductive metal electrode and the thermoelectric element 13. Materials which have exhibited favorable characteristics as diffusion barriers include nickel and iron. As best seen in FIGURES 1 and 3, thin nickel end caps 29, circular discs about 0.002 inch thick, are bonded to the PbTe elements. When PbSnTe is utilized as the p-type material, iron end caps 29 of a like thickness are used.

The end caps 29 are preferably attached to the thermoelectric elements by brazing, using suitable brazing materials, although other methods may be used. To assure a secure bond, the end caps 29 are preferably coated with a thin layer 31 of tin before attachment. Use of a brazing alloy which contains elements common to both compositions, such as SnTe, gives good results. Furthermore, use of this intermediate brazing material between the semiconductor material and the end cap also provides a better stress-distributing pattern during high temperature operation than does a straight nickel-to-semiconductor weld.

The thermoelectric elements, with end caps 29 attached, are then connected to the electrode members in a manner to provide satisfactory thermal and electrical conducting bonds. Various materials, well known in the art of bonding metal to metal, may be used for the bonds. For example, a gold-filled epoxy resin, which provides a low-resistance path for the flow of heat and electrical current, may be used if the contemplated operating temperature does not exceed about 300° C. Spot-welding, in the manner shown, is considered preferable.

It is important that these bonds be designed to withstand the stresses to which they are subjected as a result of the difference in the thermal coefficients of expansion between the two different metals. Failure of a bond results in loss of one or more thermocouples from the power generating circuit.

It has been found that by providing circular apertures 33 in the radiator 15, and in the collector plates 17, at the points of junction with the thermoelectric elements 13, connections are provided which survive the thermal stresses occurring during long periods of high temperature operation. The apertures 33 are of smaller diameter than the circular end caps 29 so that the end caps do not fit through the apertures. As best seen in FIGURE 3, spot-welds 35 are provided between the flat outer surface of each end cap 29 and the inner edge of the apertures 33 in the electrode material. In addition to having excellent mechanical strength in the operating temperature range of the panel 11, bonds made in this manner also have very low electrical resistance, another desirable feature in a generating panel of this type.

If the panel 11 is to be used in a portable power supply, the ratio of output electrical power, in comparison to the weight of the panel, is an important feature. In such an application the panel 11 is made as light in weight as possible while still providing sufficient mechanical strength to withstand shocks and vibrations. Accordingly, the heat sink 15 and the collector pates 17 are made from materials as thin as practicable with regard to these considerations. Additional mechanical strength is imparted to the panel 11 by means of reinforcing bolsters 37 attached to the thin radiator plate section 25. The bolsters 37 may have various suitable shapes. In the illustrated embodiment, honeycomb strips 39 are provided, covered with thin aluminum sheaths 41.

Each honeycomb strip 39 comprises a plurality of thin aluminum strips which are bonded together in a honeycomb arrangement to provide good structural strength with minimum weight of material. Other materials have been found to be satisfactory as honeycomb materials, such as asbestos and resin impregnated glass fibers. So as not to interfere with the electrical operation of the panel 11, the bolster 37 is electrically insulated from the heat sink 15 which it reinforces. Various suitable high temperature insulating materials can be used for this bond. Epoxy resins, silicone resins and fused high temperature glass have been found to give good results. The sheath 41 further stiffens the panel by adding rigidity to the honeycomb strip. The sheath 41 is secured to the honeycomb 39 with a suitable high temperature insulating material, such as the aforementioned epoxy resins, silicone resins, or fused glass.

As previously mentioned, the housing 21 in combination with the heat sink 15 provides a gas tight enclosure for the thermoelectric elements 13. An inlet 43 and an outlet 45 in one side wall of the housing 21 provide communication with the panel interior and afford easy regulation of the atmosphere therein.

It has been found that the operating life and the performance of the panel 11 is improved if the atmosphere about the thermoelectric elements 13 is controlled. At the operating temperatures, there is some slight reaction between the thermoelectric materials and atmospheric oxygen, which reaction shortens their expected lifetime. Such oxidation can be prevented either by establishing a vacuum within the panel 11 or by providing an inert gas atmosphere. Provision of a vacuum is considered preferable, depending somewhat upon the situation in which the panel 11 is to be used.

When a gas is present in the space between the hot side and the cold side of the thermocouples, there is some heat lost which bypasses the thermocouples when it is transferred by convection or conduction from collector surfaces of the panel to radiator surfaces by the convective movement of the gas. When a vacuum is provided within the panel, this bypass of heat is substantially eliminated, with a concurrent rise in the operating efficiency of the panel. Although vacuum conditions are most effective in preventing bypass heat loss, a low pressure, less than one atmosphere, of an inert gas transfers little heat by convection or conduction.

The above described embodiment shown in FIGURES 1 through 3 is particularly useful for terrestrial applications, either in the earth's atmosphere or under water. The environment surrounding the elements 13 can be controlled, and the fins 26 provide heat transfer away from the heat sink 15 by conduction and convection as well as radiation.

Another embodiment of the invention is shown in FIGURES 4 through 7. In these figures, a panel 51 is illustrated which comprises a tubing or piping arrangement 53 sandwiched between two separate modules 55, each of which is generally similar in configuration to the panel 11 described above. The tubing arrangement 53 is adapted to convey a hot fluid through the panel and thus serves as heat supply means. A fraction of the heat given up by the fluid during its travel is converted to electric energy by the modules 55.

The panel 51 is especially useful in combination with a nuclear reactor or radioisotope that provides a heat source for a high temperature fluid, such as liquid sodium or the like, having thermal energy which it is desirable to convert into electrical energy.

In the panel 51, the tubing arrangement 53 comprises an inlet header 57 and an outlet header 59 having a bank of parallel, cross-connecting tubes 61 which extend therebetween. In operation, the fluid enters the inlet header 57 at its highest temperature, flows across the panel 51, and exits by way of the outlet header 59 at a considerably lower temperature. Accordingly, there is a substantial difference in temperatures between the inlet side of the panel 51 and outlet side. The modules 55 are mounted by brackets 62 attached to the inlet header 57 and outlet header 59 as shown in FIG. 5.

In an electrical power generating module of this general type, it is preferable to keep the hot junction temperatures of all the thermocouples at as close to their maximum operating temperature (maximum capability) as is possible. Differences in temperatures of the thermocouple hot junctions and the resultant E.M.F.'s cause non-productive. circulating electric currents to be induced between the thermocouples at the hotter end and the thermocouples at the cooler end, resulting in a lowering of the operating efficiency of the module.

It has been found that by using radiation coupling, it is possible to closely regulate the amount of thermal energy flow from the tubing arrangement 53 to the various thermocouples so that the hot junction temperature of each thermocouple is about the same across the entire surface of the module 55.

Figures 4, 5, 6, 7:
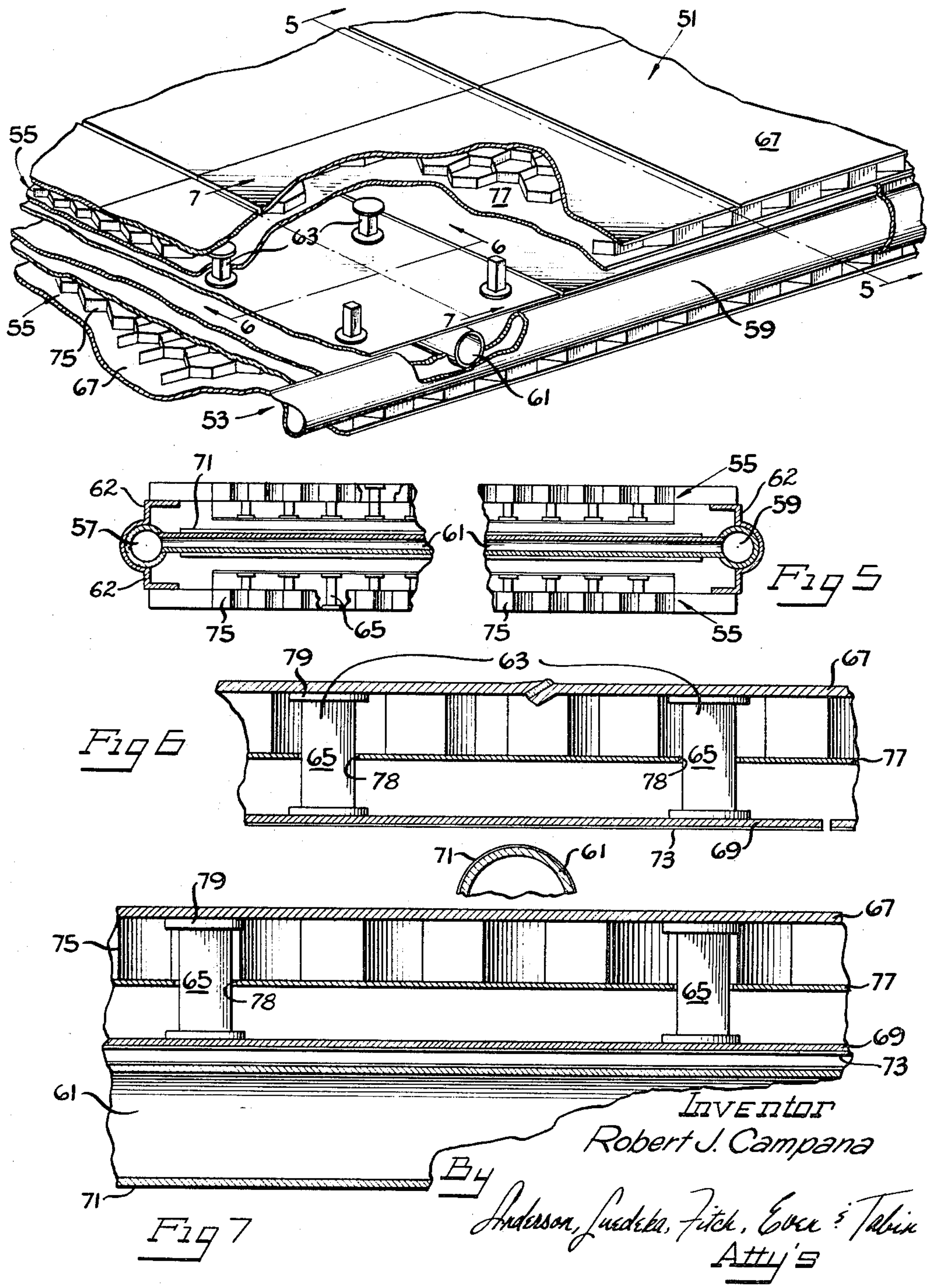
FIGURE 4 is a fragmentary perspective view of an alternate embodiment of a thermoelectric panel.
FIGURE 5 is a sectional view, reduced in size, taken generally along line 5—5 of FIGURE 4.
FIGURE 6 is an enlarged fragmentary sectional view taken along line 6—6 of FIGURE 4.
FIGURE 7 is an enlarged fragmentary sectional view taken along line 7—7 of FIGURE 4.

As best seen in FIGURE 7, each of the modules 55 includes a plurality of thermocouples 63, comprising pairs of n-type and p-type thermoelectric semiconductor elements 65, mounted on a heat sink or radiator 67 at their cold junction points. Thin collector plates 69 electrically interconnect the hot junction points of adjacent elements 65 and collect the heat radiated by the tubing arrangement 53. As seen in FIGS. 5–7, the brackets 62 support the modules 55 in locations where the radiators 67 are spaced from the tubes 61 a distance greater than the length of the thermoelectric elements 65 plus the thickness of the collector plates 69 so there is a gap between the collector plates and the adjacent tube across which gap heat is primarily transferred by radiation.

By selectively coating the tubes 61 and the collector plates 69, the effective heat transferred from the tubing arrangement to each thermocouple 63 is made substantially equal. The tubes 61 are coated with a highly emissive coating 71 in order to radiate as much heat as possible to the collector plates 69. The collector surfaces of the plates 69 are coated with a variable-emissive coating 73 so that the thermal absorptivity of the individual plates 69 increases from the hot or inlet end of the panel 51 to the cold or outlet end of the panel, i.e., the absorptivity adjacent the outlet end is higher than the absorptivity adjacent the inlet end. Additionally the tubes 61 could be coated with a variable-emissive coating. Thus, as the bulk temperature of the fluid flowing through the tubing arrangement 53 drops during its travel across the panel from upstream to downstream, the increase in absorptivity of the collector plates 69 exactly compensates for this temperature drop, providing a uniform hot-junction temperature across the entire panel. Also, the hot junctions of all the thermocouples 63 can be held at about the highest operating temperature compatible with their design life, providing the panel 51 with very good thermal efficiency.

Generally, the tubes 61 should be coated with a material that has a high emissivity in the wave lengths corresponding to its operating temperature. Similarly, the collector plate coating 73 should have a high value of absorptivity in the energy band of the radiation from the tube surfaces. Either step-wise or continuous change in absorptivity may be employed to provide the collector plates 69 with a surface of varying or differing absorptivity. A continuously varying surface, for example one continually changing in color shade along its length, is theoretically preferable but is practically more difficult to manufacture.

The coatings may be accomplished in any manner and using any materials suitable for the contemplated temperature ranges. Methods of application of coating may include, but are not limited to, painting, flame-spraying, plasma-arc spraying, vapor-deposition, electrolytic-deposition, etc.

If the tubes 61 will carry liquid sodium or the like, they are preferably made from stainless steel although other materials may be used. Stainless steel tubes 61 may be given a darkened, highly emissive surface coating 71 in various ways, for example, by oxidation, or by coating with black nickel oxide.

The collector plates 69 are preferably made of aluminum although other suitable materials may be used. Anodization may be conveniently employed to give aluminum plates a continuous coating of varying absorptivity. By controlling the thickness of the anodized layer, between about 0.25 micron and about 7 microns, the absorptivity of the anodized aluminum may be varied from about 4% to more than about 75% of that of a blackbody.

To accomplish a step-wise variation of absorptivity, striation of the plates 69, using two coating materials, one having a high absorptivity and one having a low absorptivity, may be employed. The dimensions of the striations should be small compared with the collector plate area that is associated with a single thermocouple 63. This arrangement creates an over-all effective absorptivity for each portion of collector plate associated with a thermocouple which is intermediate in value between the absorptivity values of the two separate coating materials. Because the number of stripes of one material, relative to the number of stripes of the other material, determines the effective value, the absorptivity value can be altered easily between the limits set by the individual materials. Using only two coating materials, values of increasing absorptivity can be progressively provided from the inlet side to the outlet side of the panel.

Striations of the type envisioned may be produced in any suitable way. For example, a mask may be applied to a reflective metal, such as aluminum, while a coating having a high absorptivity is spray-painted thereon. Depending upon the material chosen for the collector plates 69, methods of producing striations may also include etching, electrode plating, and ruling machine anodization.

The increased performance as a result of the use of radiation coupling plus the use of variable absorptivity coatings make it possible to utilize a greater temperature drop between the fluid inlet and the fluid outlet than has been feasible with conductively coupled panels using a liquid heat source. Conductively coupled panels were generally limited to utilizing a liquid heat source temperature drop between inlet and outlet of about 20° C. since larger temperature differentials resulted in either a reduction in thermoelectric output toward the cold or outlet end of the panel, or a hot junction temperature of the thermocouples located at the hot or inlet end of the panel in excess of the temperature limitations required to achieve the design life of the panel. With the uniform temperatures of the hot junctions afforded by controlled radiation, a temperature of the liquid of more than 100° C. is possible in the panel 51.

Numerous advantages are derived from the use of a larger temperature drop. Smaller diameter tubes 61 may be used because the volume flow rate of the liquid will be proportionately less than was previously necessary to achieve the same amount of heat transfer. Electrical insulation necessary to isolate the modules 55 from the tubing arrangement 53 and which is generally positioned at the surface of the radiator 67 will be at a temperature of more than 100° C. cooler than that at the hot junction points, rather than a few degrees C. hotter when conductive coupling is employed.

The outer surfaces of the radiator 67 are preferably also coated with a highly emissive coating which is designed to radiate as much heat as possible per unit area therefrom. For most efficient operation, it is important to keep the cold-junction temperature at a desirably low value, relative to the hot junction temperature but high enough to radiate all the heat. Preferably, the radiators 67 are made from thin sheets of aluminum of a thickness of about 0.002 to 0.004 inch which have been coated with materials, such as zinc oxide, zirconium oxide or aluminum oxide.

An over-all aluminum honeycomb structure 75 is also provided which is secured to the inner surface of each of the radiators 67 to reinforce them. As previously mentioned, glass fiber is also a suitable honeycomb structure. The honeycomb 75 is broken in the area of each of the thermoelectric elements 65 so as not to interfere therewith. A thin overlay sheet 77 of aluminum is provided to sandwich the honeycomb 75 between it and the radiator 67 and increase the rigidity. The sheet 77 has apertures 78 cut therein through which the thermoelectric elements 65 pass. The sheet 77 increases the rigidity of the honeycomb structure. As seen in FIG. 5, the brackets 62 which support the modules 55 are secured to this sandwich of radiator 67, honeycomb 75 and overlay sheet 77.

The connections between the thermoelectric elements 65, their end caps 79 and the collectors 69 and radiators 67 are the same as described in respect of the panel 11 shown in FIGURES 1–3.

Because the whole panel 51 or modules 55 of substantial size need only be insulated and mechanically attached by the brackets 62 to the header and tube assembly conveying heat from the source to the panel, rather than there being attachment at each and every element as in conductively coupled devices, truly modular panel design is achieved which permits and facilitates removal and replacement of broken or damaged converters without piercing the hermetically sealed headers and tubing. The mechanical and thermal separability of the liquid carrying and thermocouple panel subassemblies also permits independent development and test of these components and their subsequent mechanical attachment and operation flexibility when made part of an operating system.

The embodiment shown in FIGURES 4 through 7 is particularly useful for space applications. No control of the environment of the thermoelectric elements 65 is necessary since essentially a vacuum exists in space. The use of fins is not advantageous in space applications since the only possible mode of heat dissipation is by radiation. Thus the size and temperature of the radiators 67 are designed to transfer sufficient heat from the panel 51 without the aid of fins.

The following example describes a specific embodiment of a panel, fabricated with the general design of the panel shown in FIGURES 4 through 7. This example is not intended to limit the invention in any manner but merely points out one workable method of producing a suitable panel.

*Example*

A panel 51 having an over-all thickness of about ⅝ inch is produced which includes a pair of flat modules 55 which sandwich a tube array 53 suitable for carrying a high temperature fluid, such as liquid sodium or potassium. The tubing array 53 utilizes stainless steel tubes having an internal diameter of about 0.19 inch and a wall thickness of about 0.03 inch. Ten cross tubes 61 of this size are provided between an inlet header 57 and an outlet header 59. The tubes 61 are coated by oxidizing in air at elevated temperatures, preferably at about 900° C. for 8 hours.

Each of the two modules 55 is provided with two hundred thermocouples 63 which are electrically connected in series, to provide twenty rows of ten thermocouples 63 each in a direction parallel to the headers 57, 59, by the collector plates 69 and the radiators 67. The twenty rows of series-connected thermocouples 63 are also connected in parallel by the collector plates 69.

N-type thermoelectric elements 65 of PbTe and p-type thermoelectric elements PbSnTe are utilized having individual dimensions, in millimeters, of 1.0 x 1.0 x 2.5 long. The radiators 67 are made from aluminum sheeting having a thickness of about 0.002 inch which are coated on their outer surfaces with Krylon Black paint having an emissivity of about 0.9.

The collector sheets 69 are also made from aluminum of a thickness of about 0.002 inch and are provided with black striations made by anodization defining five general zones of different effective absorptivities, progressively increasing in absorptivity from the inlet side of the panel 15 to the outlet side. Each of the zones encompasses two rows of series-connected thermocouples. The approximate effective absorptivity of each of the five zones is as follows: 0.67, 0.71, 0.75, 0.79 and 0.90. The zone with the lowest absorptivity is located adjacent the inlet side, and the zone with the highest absorptivity is located adjacent the outlet side to achieve approximate equalization of hot-junction temperatures.

In operation, the flow through the tube array 53 is regulated so the inlet header 57 is maintained at a temperature of about 600° C. and the output header 59 at about 500° C., thus providing a temperature drop of about 100° C. At these operating temperatures, the hot-junction temperature of the thermocouples 63 is about 430° C., and the cold-junction temperature is about 280° C.

Measurement of an individual thermocouple 63 shows that the electrical current per thermocouple is about 0.184 amp and the terminal voltage of each thermocouple is about 26 millivolts, resulting in about 48 milliwatts of electrical power per thermocouple. This provides overall power of about 1.9 watts for the entire panel which includes four hundred thermocouples. The thermoelectric efficiency of the panel figures to be about 2.51%, which is considered satisfactory under these conditions for a generator which converts thermal energy directly to electric energy. The panel has a power output ratio of about 10 watts per pound.

Various other features of the invention are set forth in the following claims.

I claim:

1. A method of making a thermoelectric panel comprising the steps of providing a plurality of thermoelectric elements, electrically interconnecting pairs of said elements to provide a plurality of thermocouples having hot sides and cold sides for providing an electrical potential, brazing metallic end caps to the thermoelectric elements at the cold sides thereof, bonding the end caps to a heat-sink support plate, striating thermally conductive collector plates with a coating material to impart differing heat absorption characteristics to said plates so that the radiative absorptivity of said collector plates increases in a predetermined direction, securing the collector plates to the hot side of said elements, and radiatively coupling the striated collector plates with a source of radiant thermal energy that lessens in intensity in said predetermined direction, said collector plates being arranged with the plate having the lowest absorptivity adjacent the end of said energy source having the highest intensity and with the plate having the highest absorptivity adjacent the end of said source having the lowest intensity, whereby said collector plates collect radiant thermal energy from said source and transfer it to said thermocouples in such a manner that the hot side temperatures of said plurality of thermocouples are substantially equal.

2. In a thermoelectric panel, a support structure including heat-sink plate means, a plurality of thermoelectric elements each being bonded at its cold junction point to said plate means so that the hot junction point of each element is isolated from said support structure, collector means secured to each element at the hot junction point thereof and electrically connecting adjacent elements into a plurality of thermoelectric pairs, and radiation heat emission means connected to said support structure and spaced from said collector means, the intensity of radiation from heat emission means being different adjacent different pairs of thermoelectric elements, said collector means having differing absorptivity for radiant energy and being arranged with the absorptivity of said collector means which is lowest adjacent the portion of said heat emission means which has the highest intensity of radiation and with the absorptivity of said collector means which is highest adjacent the portion of said heat emission means which has the lowest intensity of radiation.

3. A thermoelectric device comprising a plurality of heat sink plates, electrically insulating structural bonds connecting each heat sink to the next adjacent heat sink, structurally reinforcing honeycomb means secured to the inner surface of said heat sink plates, pairs of thermoelectric elements having end caps at each end thereof, said end caps at the cold junctions thereof being bonded to said heat sinks, thermally and electrically conductive thin sheets for collecting radiant energy, means bonding said thin sheets only to the hot-junction end caps of pairs of thermoelectric elements, which pairs are connected at the cold junction points thereof to different heat sinks, and leaving said radiant energy collector sheets structurally unconnected to said heat sinks except through said thermoelectric elements, and a tube for carrying a heated fluid spaced from said collector sheets but aligned adjacent a plurality of said collector sheets which interconnect a plurality of said pairs of thermoelectric elements in parallel electric connection, said collector sheets extending parallel to said tube and being provided with differing radiative absorptivities, the intensity of radiation from said tube decreasing in the direction of flow of heated fluid therethrough from uptsream to downstream, and the absorptivity of the collector sheet adjacent the upstream end of said tube being lower than the absorptivity of the collector sheet adjacent the downstream end.

4. A thermoelectric device comprising a plurality of T-shaped heat sinks having apertures in the flat upper plate sections thereof, electrically insulating structural bonds connecting each heat sink to the next adjacent heat sink pairs of thermoelectric elements having end caps at each end thereof, said end caps at the cold junctions thereof being larger in size than said apertures and being bonded to said heat sinks via connection between the inner edge of said apertures and the outer surface of said end cap, thermally and electrically conductive thin sheets for collecting radiant energy, apertures in said sheets smaller in size than said end caps at the hot junction points of said thermoelectric elements, and means bonding the inner edges of said apertures in said sheets to said hot-junction end caps of pairs of thermoelectric elements which pairs are connected at the cold junction points thereof to different heat sinks and leaving said radiant energy collector sheets structurally unconnected to said heat sinks except through said thermoelectric elements.

5. A thermoelectric device in accordance with claim 4 wherein said bonds between said end caps and said inner edges of said apertures are spot welds.

6. A thermoelectric device comprising a plurality of heat sink plates having apertures therein, electrically insulating structural bonds connecting each heat sink to the next adjacent heat sink, structurally reinforcing honeycomb means secured to the inner surface of said heat sink plates, pairs of thermoelectric elements having end caps at each end thereof, said end caps at the cold junctions thereof being larger in size than said apertures and being bonded to said heat sinks via a connection between the inner edge of said apertures and the end surface of said end cap, thermally and electrically conductive thin sheets for collecting radiant energy, apertures in said sheets smaller in size than said end caps at the hot junction points of said thermoelectric elements, means bonding the inner edges of said apertures in said thin sheets only to the hot-junction end caps of pairs of thermoelectric elements, which pairs are connected at the cold junction points thereof to different heat sinks, and leaving said radiant energy collector sheets structurally unconnected to said heat sinks except through said thermoelectric elements, and a tube for carrying a heated fluid spaced from said collector sheets but disposed in association with a plurality of said pairs of thermoelectric elements.

7. A thermoelectric device in accordance with claim 6, wherein said tube is aligned adjacent one of said collector sheets which interconnects a plurality of said pairs of thermoelectric elements in parallel electric connection and wherein said one collector sheet extends parallel to said tube and is provided with differing absorptivity in the direction parallel to said tube, the intensity of radiation from said tube decreasing in the direction of flow of heated fluid therethrough from upstream to downstream, and a portion of said collector sheet adjacent an upstream portion of said tube having a lower absorptivity than a portion of said collector sheet adjacent a downstream portion of said tube.

8. A thermoelectric panel comprising heat supply means, a pair of heat-sink means on opposite sides of said heat supply means, means connected to said heat supply means mounting said heat-sink means in spaced relation from said heat supply means, a plurality of thermoelectric elements disposed in the space between opposite sides of said heat supply means and each respective heat-sink means, each of said elements being bonded at its cold junction point to one of said heat-sink means, means electrically connecting adjacent elements into electric current generating thermocouples, means for collecting radiant energy from said heat supply means secured to said elements at hot junction points thereof, said space being of greater dimension than the corresponding dimension of said thermoelectric elements plus said collecting means to provide a gap between said heat transfer means and said collecting means whereby heat is primarily transferred from said heat supply means to said collecting means via radiation across said gap.

9. A thermoelectric panel comprising radiant heat transfer means including a generally planar tubing array adapted to carry a heated liquid, said array having an inlet header and outlet header and a plurality of tubes extending between said headers, a pair of radiator plates on opposite sides of said heat transfer means which provide cold side plates for the panel, means connected to said heat transfer means mounting said radiator plates in spaced relation to said heat transfer means, a plurality of thermoelectric elements disposed between said heat transfer means and each of said radiator plates, each of said elements being bonded at a cold junction point to one of said radiator plates, plates for collecting radiant energy from said heat transfer means secured to said elements at hot junction points thereof and electrically connecting adjacent elements and structurally unconnected to said radiator plates except through said thermoelectric elements, means coating said tubes so that they are highly emissive, and means coating said collector plates with coatings of differing radiative absorptivity, sad radiative absorptivity of said collector plate coatings progressively increasing, with said collector plates adjacent the end of said tubes near said inlet header having an absorptivity less than that of said collector plates adjacent the end of said tubes near said outlet header.

References Cited

UNITED STATES PATENTS

| | | | |
|---|---|---|---|
| 3,053,923 | 9/1962 | Stearns | 136—206 |
| 3,100,969 | 8/1963 | Elfving | 62—3 |
| 3,196,049 | 7/1965 | Schilke | 136—6 X |
| 3,247,578 | 4/1966 | Jaremus et al. | |
| 3,306,784 | 2/1967 | Roes | 136—237 |
| 1,848,655 | 3/1932 | Petrik | 136—212 |
| 2,951,105 | 8/1960 | Busanovich | 136—203 X |
| 2,984,696 | 5/1961 | Shaffer | 136—206 |
| 2,989,575 | 6/1961 | Wallace | 136—89 |
| 3,006,979 | 10/1961 | Rich | 136—204 |
| 3,023,257 | 2/1962 | Fritts | 136—206 |
| 3,075,031 | 1/1963 | Hockings et al. | 136—238 |
| 3,111,813 | 11/1963 | Blumentritt | 136—204 |
| 3,167,926 | 2/1965 | Wepfer et al. | 136—204 |
| 3,197,343 | 7/1965 | Palmatier | 136—212 |

ALLEN B. CURTIS, *Primary Examiner.*

UNITED STATES PATENT OFFICE
CERTIFICATE OF CORRECTION

Patent No. 3,413,156

November 26, 196

Robert J. Campana

It is certified that error appears in the above identified patent and that said Letters Patent are hereby corrected as shown below:

Column 3, line 67, beginning with "Now referring" cancel all to and including "various of" in line 71, same column 3, and insert -- Now referring particularly to FIGURES 1-3, a thermoelectric panel 11 is illustrated which embodies various of the features of the invention. The panel 11 generally comprises a plurality of thermoelectric elements 13 each --. Column 7, line 24, "non-productive." should read -- non-productive, --. Column 12, line 72, "sad" should read -- said --.

Signed and sealed this 10th day of March 1970.

(SEAL)
Attest:

Edward M. Fletcher, Jr.
Attesting Officer

WILLIAM E. SCHUYLER, JR.
Commissioner of Patents